(12) United States Patent
Wietzke et al.

(10) Patent No.: US 6,421,631 B1
(45) Date of Patent: Jul. 16, 2002

(54) DIAGNOSTIC PROCEDURE FOR ELECTRICAL APPLIANCES

(75) Inventors: Joachim Wietzke, Hildesheim; Klaus-Erwin Groeger, Diekholzen, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/242,765

(22) PCT Filed: Jul. 14, 1997

(86) PCT No.: PCT/DE97/01476
§ 371 (c)(1),
(2), (4) Date: Dec. 21, 1999

(87) PCT Pub. No.: WO98/08103
PCT Pub. Date: Feb. 26, 1998

(30) Foreign Application Priority Data

Aug. 22, 1996 (DE) .......................................... 196 33 785

(51) Int. Cl.⁷ ............................................... G01R 31/00
(52) U.S. Cl. .......................................... 702/183; 701/29
(58) Field of Search ........................... 702/183; 701/33, 701/29; 455/226.1

(56) References Cited

U.S. PATENT DOCUMENTS 5,916,286 A * 6/1999 Seashore et al. .............. 701/29

FOREIGN PATENT DOCUMENTS

| EP | 0 231 607 | 8/1987 |
| EP | 0 671 631 | 9/1995 |
| WO | 88 02122 | 3/1988 |
| WO | 89 06839 | 7/1989 |
| WO | 92 14216 | 8/1992 |

* cited by examiner

Primary Examiner—Kamini Shah
(74) Attorney, Agent, or Firm—Kenyon & Kenyon

(57) ABSTRACT

A diagnostic method for electrical devices, in particular automobile radio devices, is proposed, offering a capability of easily delivering a test routine to the device via a chip card, and querying the test results by the same route.

5 Claims, 1 Drawing Sheet

DIAGNOSTIC PROCEDURE FOR ELECTRICAL APPLIANCES

FIELD OF THE INVENTION

The method relates to a diagnostic method for electrical devices, in particular automobile radio devices.

BACKGROUND INFORMATION

Some conventional automobile radio devices have a testing, adjustment and starting interface apparatus are known. This very fast bus interface allows, both during the production process and for service purposes, fast and standardized test sequences which can be performed under computer control. For this purpose, minimal software which supports these tests is integrated into the devices in a memory. This software, which is generally stored in RAM, can load and start a test program which is connected from the outside to the interface. All that is necessary for this is a short program routine. Once the test is complete, the result is reported back via the interface. In this context, the test times should be kept as short as possible, which is achieved by appropriate design of the data bus between the control computer and the device to be tested.

Some conventional automobile radio devices also have a reading device for the introduction of a chip card. The chip card contains a security code. Operation of the automobile radio is possible only if the security code via the chip card agrees with the code stored in the automobile radio.

SUMMARY OF THE INVENTION

The diagnostic method according to the present invention has the advantage, in contrast, that diagnosis of the functions of the device is possible without having to remove the device from the vehicle. In addition, troubleshooting is also possible utilizing the device environment directly in the installed state. Diagnosis is thus expanded to encompass real operating conditions, e.g. including all connected components. The diagnostic method takes place directly on the device: no wiring or soldering of connecting wires is necessary, and it is also not necessary to connect a computer or tester.

It is particularly advantageous that the results of the diagnosis are written back onto the chip card which contains the test software.

It is furthermore advantageous that the results can also be output directly to the device's display.

For many test instances it is necessary to load larger test programs into the device, so that the storage capabilities of a single chip card are not sufficient. With our method according to the present invention, however, it is easily possible to distribute the test software among several chip cards and read them successively into the device.

DETAILED DESCRIPTION

Figure 1:
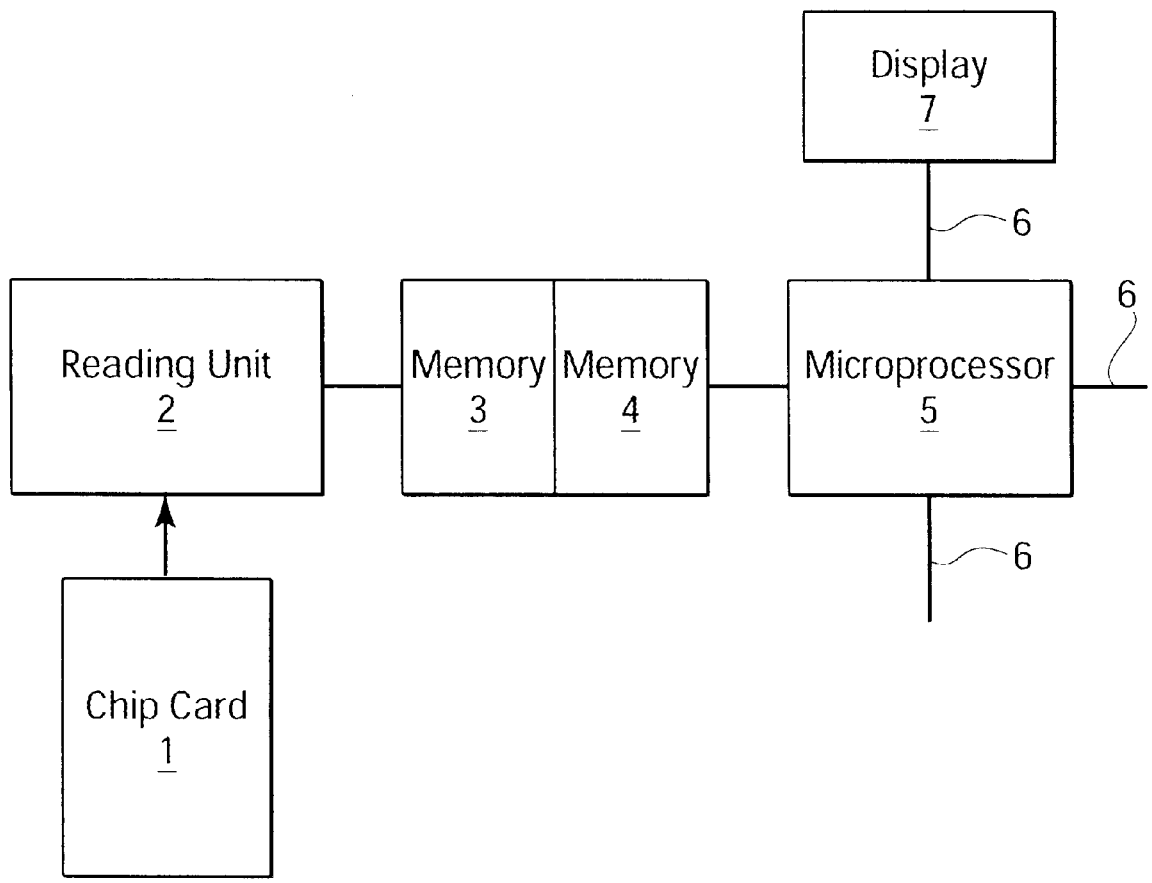
FIG. 1 schematically shows the configuration of a device with a chip card interface.

FIG. 1 schematically shows the configuration of a device that is investigated with the diagnostic method according to the present invention. A chip card 1 is introduced into reading unit 2 provided in the device, and contacted via the ISO interface. The data contained on the chip card, generally the test software, is loaded into memory 3 via the ISO interface. The loading operation itself is controlled by a loading routine that is contained in a nonvolatile memory 4. Overall control of the system is handled by a microprocessor 5. The device then executes, with the aid of the test routine located in memory 3, a diagnosis of its entire system, while the complete system is connected via terminals 6 to the processor.

The test software with the various test functions is stored on the chip card, generally a memory card or multifunction card. Depending on the nature of the test and the size of the available memory on the chip card, the complete test can also be distributed among several cards with corresponding test software. When contact is made in the card slot with a card of this kind loaded with test software, the device being tested is shifted into its test mode. As a result, the test software is loaded by loading program 4 via the ISO interface into the memory region (RAM) of the device processor, and started. Either the test program is initiated by the software itself, or the user defines the start of the test via a button or a code card. The faults and results reported by the system can then be displayed on display 7 and/or written back onto the chip card. The test operator removes the chip card from the device and can make the diagnosis independently of the device. It is advantageous in this context that a diagnosis of this kind is possible on the device itself, so that the device itself does not need to be brought into a workshop or laboratory.

What is claimed is:

1. A diagnostic method for an electrical device, the electrical device including a microprocessor, a first memory and an apparatus for receiving and reading at least one chip card, the at least one chip card including a second memory device, the method comprising the steps of:

introducing the at least one chip card into the apparatus;

invoking a loading routine in the first memory via the microprocessor;

loading a test software from the second memory device of the at least one chip card into the first memory device of the electrical device;

starting the test software;

diagnosing the electrical device;

determining at least one result via the test software; and outputting the at least one result.

2. The diagnostic method according to claim 1, wherein the electrical device includes an automobile radio device.

3. The diagnostic method according to claim 1, further comprising the step of:

writing the at least one result onto the at least one chip card.

4. The diagnostic method according to claim 1, wherein the electrical device further includes a display, and wherein the at least one result is output on the display.

5. The diagnostic method according to claim 1, wherein at least one chip card includes a sequence of chip cards, and wherein the test software is loaded via the sequence of chip cards.

* * * * *